US012712450B2

(12) United States Patent
Cretone et al.

(10) Patent No.: US 12,712,450 B2
(45) Date of Patent: Aug. 18, 2026

(54) FLOATING TRICKLE CHARGE PUMP WITH AUTO TURN-OFF AND AUTO TURN-ON

(71) Applicant: STMicroelectronics International N.V., Geneva (CH)

(72) Inventors: Romino Cretone, Milan (IT); Roberto Aletti, Aosta (IT); Aldo Vittorio Novelli, S. Lorenzo Parabiago (IT); Marco Giovanni Fontana, Milan (IT)

(73) Assignee: STMicroelectronics International N.V., Geneva (CH)

( * ) Notice: Subject to any disclaimer, the term of this patent is extended or adjusted under 35 U.S.C. 154(b) by 8 days.

(21) Appl. No.: 18/969,619

(22) Filed: Dec. 5, 2024

(65) Prior Publication Data

US 2026/0163480 A1 Jun. 11, 2026

(51) Int. Cl.

| | |
|---|---|
| ***H02M 3/07*** | (2006.01) |
| ***H02M 1/00*** | (2006.01) |
| ***H02M 1/36*** | (2007.01) |
| ***H03K 17/687*** | (2006.01) |

(52) U.S. Cl.

CPC ........... *H02M 3/07* (2013.01); *H02M 1/0022* (2021.05); *H02M 1/36* (2013.01); *H03K 17/6871* (2013.01); *H03K 2217/0063* (2013.01)

(58) Field of Classification Search

CPC ........ H02M 3/07; H02M 1/0022; H02M 1/36; H03K 17/6871; H03K 2217/0063

See application file for complete search history.

(56) References Cited

U.S. PATENT DOCUMENTS

| | | | | |
|---|---|---|---|---|
| 10,469,066 | B1 * | 11/2019 | Shankar | H02P 7/28 |
| 2004/0223277 | A1 | 11/2004 | Cheng et al. | |
| 2013/0106474 | A1 | 5/2013 | Kossel et al. | |
| 2014/0062449 | A1 | 3/2014 | Qu et al. | |
| 2018/0083528 | A1 | 3/2018 | Hufnagel et al. | |
| 2020/0036372 | A1 | 1/2020 | Shankar | |
| 2024/0146193 | A1 * | 5/2024 | Fukushima | H02M 3/158 |

* cited by examiner

*Primary Examiner* — Daniel C Puentes
(74) *Attorney, Agent, or Firm* — Crowe & Dunlevy LLC

(57) ABSTRACT

A high-side driver-circuit involves a charge-pump for driving a high-side transistor. The circuit includes a high-side transistor, a low-side transistor or unidirectional conducting-device, a bootstrap-capacitor, and a trickle-charge-pump connected between the output-node and ground. The trickle-charge-pump activates when the voltage at the output-node exceeds the voltage at the low-voltage power-supply-node, alternately charging a trickle-capacitor and transferring charge to the bootstrap-capacitor. This enables continuous replenishment of the bootstrap-capacitor, allowing for extended or indefinite high-side conduction periods, including 100% duty-cycle operation. The trickle-charge-pump incorporates an auto-on/auto-off functionality, synchronizing operation with the output-node-voltage. It activates when the voltage at the output-node exceeds the voltage at the low-voltage power-supply-node and deactivates when the voltage at the output-node is less than the voltage at the low-voltage power-supply-node, enhancing overall efficiency. This design overcomes limitations of traditional bootstrap circuits without added complexity, providing an efficient approach for applications requiring sustained high-side operation in high-side driver circuits.

18 Claims, 9 Drawing Sheets

Charging CT

Charge transfer from CT to CB

Auto Turn Off

LS Phase -- Auto On

FLOATING TRICKLE CHARGE PUMP WITH AUTO TURN-OFF AND AUTO TURN-ON

TECHNICAL FIELD

This disclosure relates to high-side driver circuits in power electronics, particularly to an improved charge pump for driving high-side switches in applications such as motor controls and power inverters. This improved charge pump provides a trickle charge pump that enables extended or indefinite high-side conduction periods, including 100% duty cycle operation, while incorporating an auto-on/auto-off functionality for enhanced efficiency.

BACKGROUND

High-side drivers are utilized in power electronics to control high-side switches in applications such as motor controls and power inverters. Two primary methods have been traditionally used for driving the high-side switch: the bootstrap method and the charge pump method.

Now described with reference to FIG. 1 is system 10 including a high-side driver circuit 12 for driving a high-side switch T_HS using the bootstrap method. The low side structure could be either a low-side driver and related switch or simply a recirculation diode.

The switch circuit 20 includes: n-channel transistor T_HS having its drain coupled to voltage VS (high voltage power supply), its source connected to output node OUT, and its gate connected to a high-voltage gate node HVG; and diode DB2 having its anode connected to node SLS and its cathode connected to output node OUT. As an alternative to the diode DB2, a standard n-channel transistor T_LS could be used to obtain a common half bridge structure.

A bootstrap capacitor CB is connected between the bootstrap node BOOT and the output node OUT, and an inductor L (or other passive loads, e.g., resistive load, capacitive load, etc) is connected between the output node OUT and a low impedance node (e.g. GND, VS, or another half-bridge output).

The high-side driver circuit 12 includes a driver DRV_HS receiving as input a pre-drive signal from a level shifter 13 operating based upon a high-side input signal received at high-side input node IN_HS. The driver DRV_HS is powered between the bootstrap node BOOT and the output node OUT, and provides output to high-voltage gate node HVG.

The half-bridge driver circuit typically includes a driver DRV_LS receiving as input a low-side input signal received at low-side input node IN_LS. The driver DRV_LS is powered between a low voltage LV and the voltage at the node SLS, and provides output to low-voltage gate node LVG. The previous low-side structure could also be realized by a simple recirculation diode DB2.

The bootstrap method in system 10 operates by alternately charging the bootstrap capacitor CB and using its charge to drive the high-side transistor T_HS. As shown in FIG. 2, this process occurs in two phases based on the OUT node voltage.

When the OUT node is low, the bootstrap capacitor CB is charged through the bootstrap diode DB1 from the VCC supply (low voltage power supply). The charging occurs because the output node OUT is pulled low through transistor T_LS, or the DB2 recirculation diode, allowing current to flow from VCC through diode DB1 to the bootstrap capacitor CB.

When the OUT node rises above VCC, the charged bootstrap capacitor CB provides the necessary gate driving voltage. The high-side driver DRV_HS, powered between the BOOT and OUT nodes, uses the charge stored in the bootstrap capacitor CB to drive the gate of transistor T_HS (via the HVG node) above the floating source voltage at the OUT node.

The timing diagram in FIG. 2 illustrates this operation. The VCB trace shows the voltage across the bootstrap capacitor CB. During periods when OUT is low, VCB charges to approximately VCC-VDB (where VDB is the voltage drop across diode DB1). During the discharge period T_disch, the voltage across capacitor CB slightly decreases as it powers the high-side driver.

The OUT trace in FIG. 2 shows the switching of the high-side transistor.

This limitation of this prior art high-side driver circuit 12 becomes apparent when considering the need for a 100% duty cycle. As the bootstrap capacitor CB must periodically recharge, the OUT node must periodically go low. This requirement prevents the circuit from maintaining T_HS continuously on, thus limiting the maximum achievable duty cycle.

Now described with reference to FIG. 3 is another prior art system 10' including a half-bridge driver circuit 11' for driving a half-bridge 20' using the charge pump method.

The half-bridge driver circuit 11' includes the components described in FIG. 1, with the addition of a charge pump circuit 15. The charge pump circuit 15 provides output to the bootstrap node BOOT, and includes flyback capacitor CFLY connected between nodes P3 and P4, and a storage capacitor CST connected between nodes P1 and P2. Note that here, node P2 is connected to the voltage VS.

The charge pump circuit 15 includes two diodes: diode D1, with its anode connected to node P3 and its cathode to the node P1, and diode D2, with its anode connected to node P2 and its cathode connected to node P3. The charge pump circuit 15 also includes a buffer BUF receiving input from an oscillator OSC and having its output connected to node P4. A current source SRC, controlled by an enable signal EN, is connected between node P1 and the bootstrap node BOOT to source current to the bootstrap node BOOT.

The charge pump circuit 15 in system 10' operates to maintain the charge on the bootstrap capacitor CB, allowing for extended high-side on-time of transistor T_HS. The oscillator OSC generates a switching signal that is buffered by buffer BUF and applied to node P4, causing the flying capacitor CFLY to alternately charge and discharge. This alternating cycle allows for the continuous transfer of energy from the VS node to the bootstrap capacitor CB.

When the voltage at P4 is driven low through the buffer BUF, capacitor CFLY charges from voltage VS, through diode D2, through node P3, into capacitor CFLY.

When the voltage at P4 is driven high through the buffer BUF, the charge on capacitor CFLY is transferred through node P3 to diode D1 through node P1 to the storage capacitor CST. This oscillating action effectively "pumps" charge from a lower voltage potential to a higher one.

The current source SRC, when enabled by the EN signal, transfers charge from the storage capacitor CST, through the bootstrap node BOOT, to the bootstrap capacitor CB. This charge transfer mechanism allows the high side driver DRV_HS to maintain the necessary gate voltage to keep the high-side transistor T_HS on even when the low-side transistor T_LS remains off, or generally when OUT is higher than VCC, for extended periods. The thus overcomes the duty cycle limitations of the traditional bootstrap method, enabling the half-bridge 20 to operate at higher or even 100% duty cycles. The level shifter 13 and driver DRV_HS continue to operate as in the traditional circuit, but now with a more consistent and reliable bootstrap voltage supplied by the charge pump circuit 15.

However, the charge pump method introduces several disadvantages. For example, the method requires extra pads P1, P2, P3, P4 on the integrated circuit (IC) to accommodate external components such as CFLY and CST. If diodes D1 and D2 are not integrated, additional external diodes are needed. Even with integrated diodes, four extra pads are necessary for the connections of the charge pump circuit 15. This increases the IC's physical size and cost, and complicates PCB layout due to more external components and connections.

These disadvantages may impact the overall cost, size, and reliability of the system, making the charge pump method less desirable in certain applications.

As such, further development is needed.

SUMMARY

A high-side driver circuit may include a half-bridge with a high-side transistor connected between a voltage supply and an output node, and a low-side transistor connected between the output node and a reference node. A bootstrap capacitor is connected between a bootstrap node and the output node. A high-side driver circuit drives a control terminal of the high-side transistor. A trickle charge pump is connected between the output node and ground and charges the bootstrap capacitor during high-side conduction periods or generally when a voltage at the output node is higher than a low voltage power supply (VCC).

The trickle charge pump may include a floating low-voltage supply powered between the output node and ground. An oscillator may be powered between the output node and a voltage generated by the floating low-voltage supply. A buffer may be powered between the output node and the voltage generated by the floating low-voltage supply, and may receive an oscillator signal output from the oscillator. A trickle capacitor may be connected between an output of the buffer and an intermediate node. First and second unidirectional conducting devices may be connected between the output node and intermediate node, and between the intermediate node and bootstrap node, respectively.

The trickle charge pump may operate, when the voltage at the output node is higher than VCC, in a first phase where the trickle capacitor charges through the first unidirectional conducting device, and a second phase where charge transfers from the trickle capacitor to the bootstrap capacitor through the second unidirectional conducting device.

The trickle charge pump may include auto-on/auto-off functionality that activates the trickle charge pump when the voltage at the output node is higher than VCC and deactivates it when the voltage at the output node is lower than VCC. The trickle charge pump may be powered by the voltage at the output node.

A level shifter may provide a pre-drive signal to the high-side driver circuit based on a high-side input signal. A low-side driver circuit may drive the low-side transistor based on a low-side input signal. A simple diode can be substituted instead of the low side transistor and related driver.

The trickle charge pump may enable 100% duty cycle operation of the high-side transistor by continuously replenishing charge in the bootstrap capacitor when the voltage at the output node is higher than VCC.

Methods of operating the high-side driver circuit are also disclosed. These methods may include driving the high-side transistor to generate a voltage at the output node exceeding the voltage at the power supply node, activating the trickle charge pump when the voltage at the output node is higher than VCC, and alternately charging the trickle capacitor and transferring charge to the bootstrap capacitor under these conditions.

The methods may optionally include driving the low-side transistor to generate a voltage at the output node less than the voltage at the power supply node (or using a diode to do so), and deactivating the trickle charge pump when the voltage at the output node is lower than VCC. Deactivating may occur by connecting the output node to ground through the low-side transistor or a unidirectional conducting device (e.g., a diode).

The methods may include continuously replenishing charge in the bootstrap capacitor when the voltage at the output node exceeds the voltage at the power supply node to enable 100% duty cycle operation of the high-side transistor. Level-shifting of input signals and pre-drive signal generation may also be performed.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Figure 4:
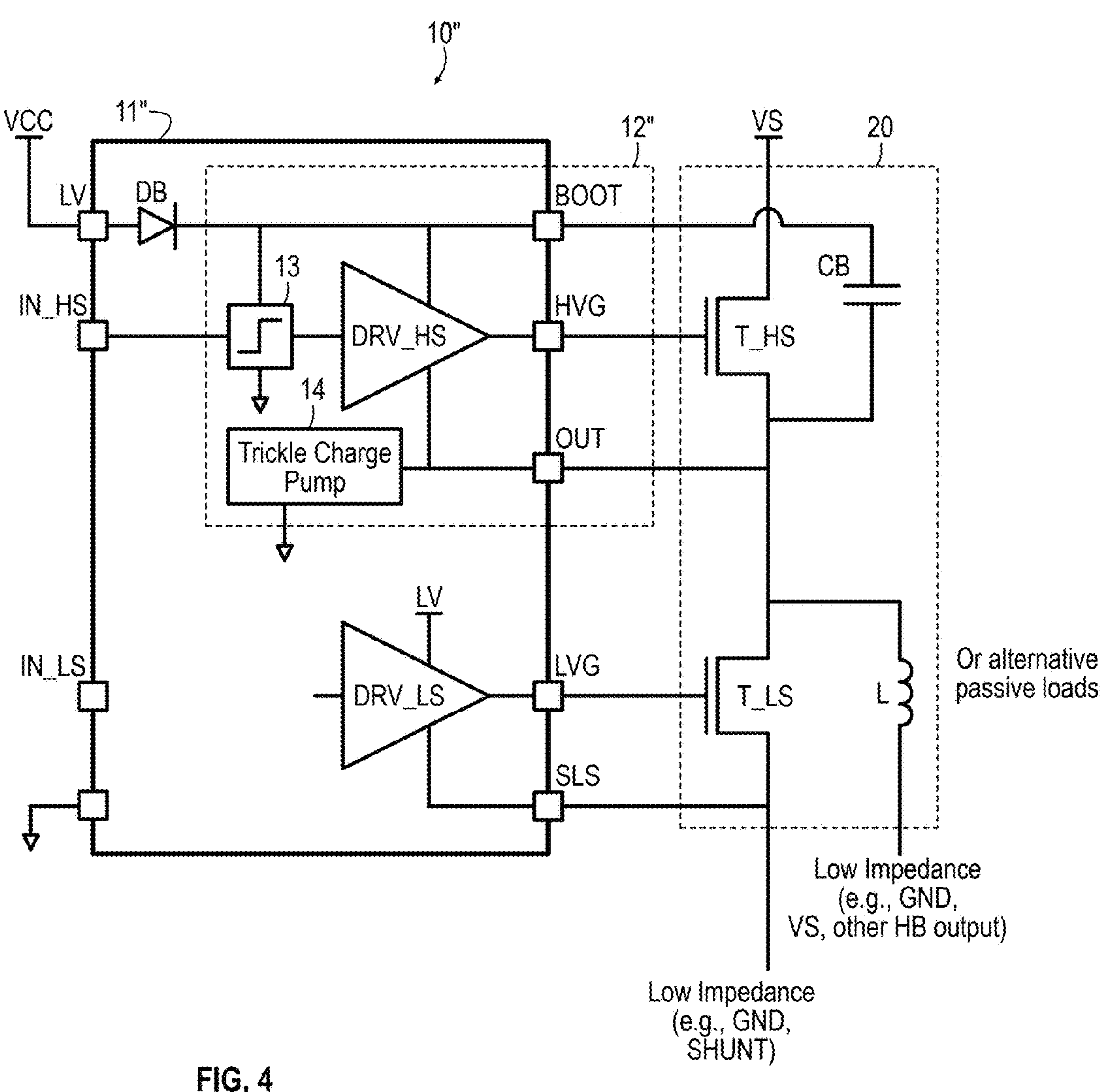
FIG. 4 is a schematic block diagram of a high-side driver circuit disclosed herein that utilized an improved charge pump method.

Now described with reference to FIG. 4 is system 10" including a half-bridge driver circuit 11" for driving a half-bridge 20 using an improved charge pump method.

Figure 1:
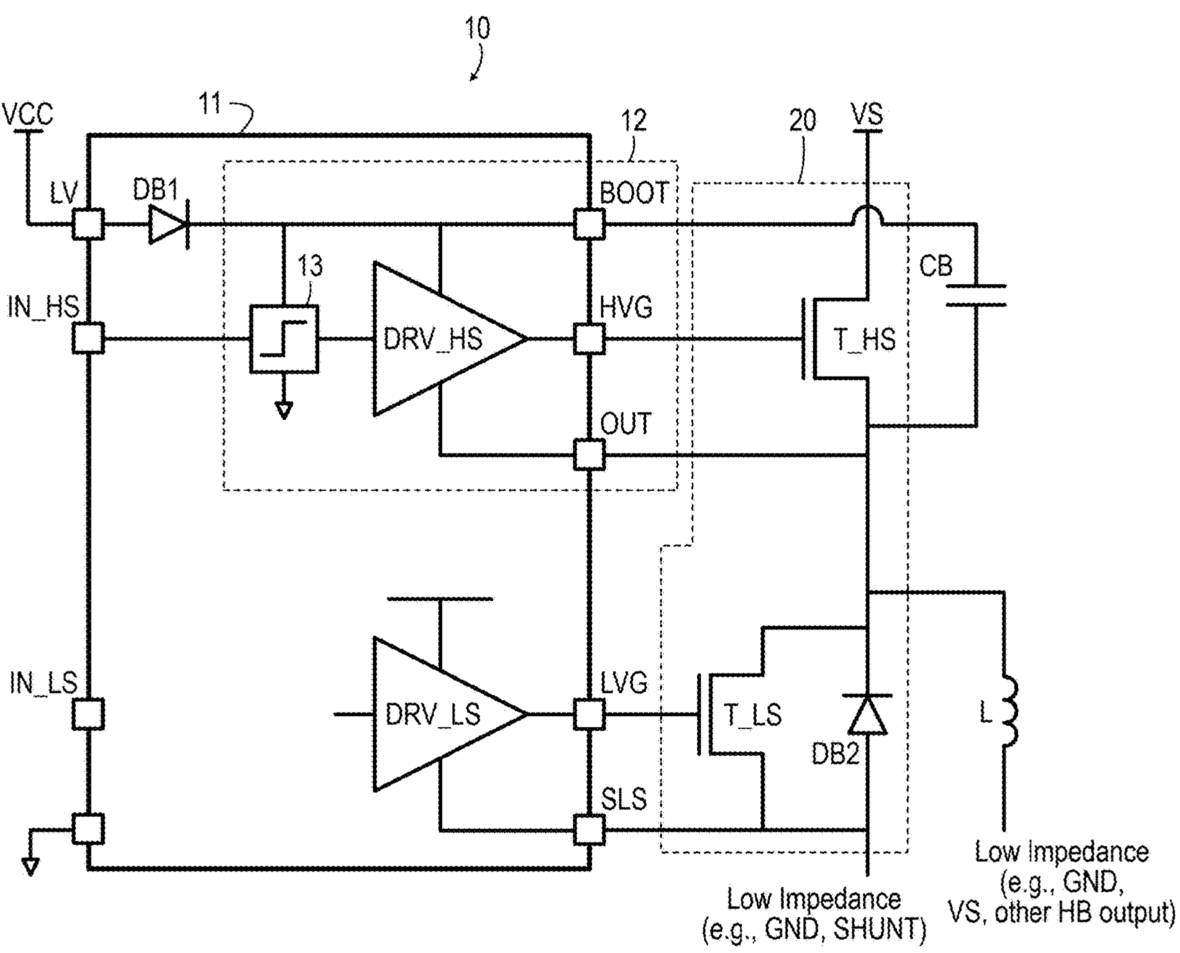
FIG. 1 is a schematic diagram of a prior art high-side driver circuit using the bootstrap method.
Figure 2:
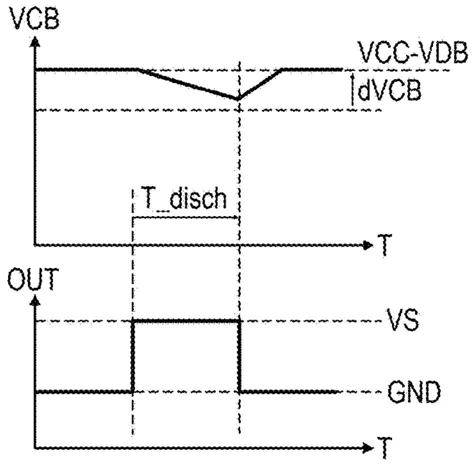
FIG. 2 shows a timing diagram for the operation of the prior art bootstrap method.
Figure 3:
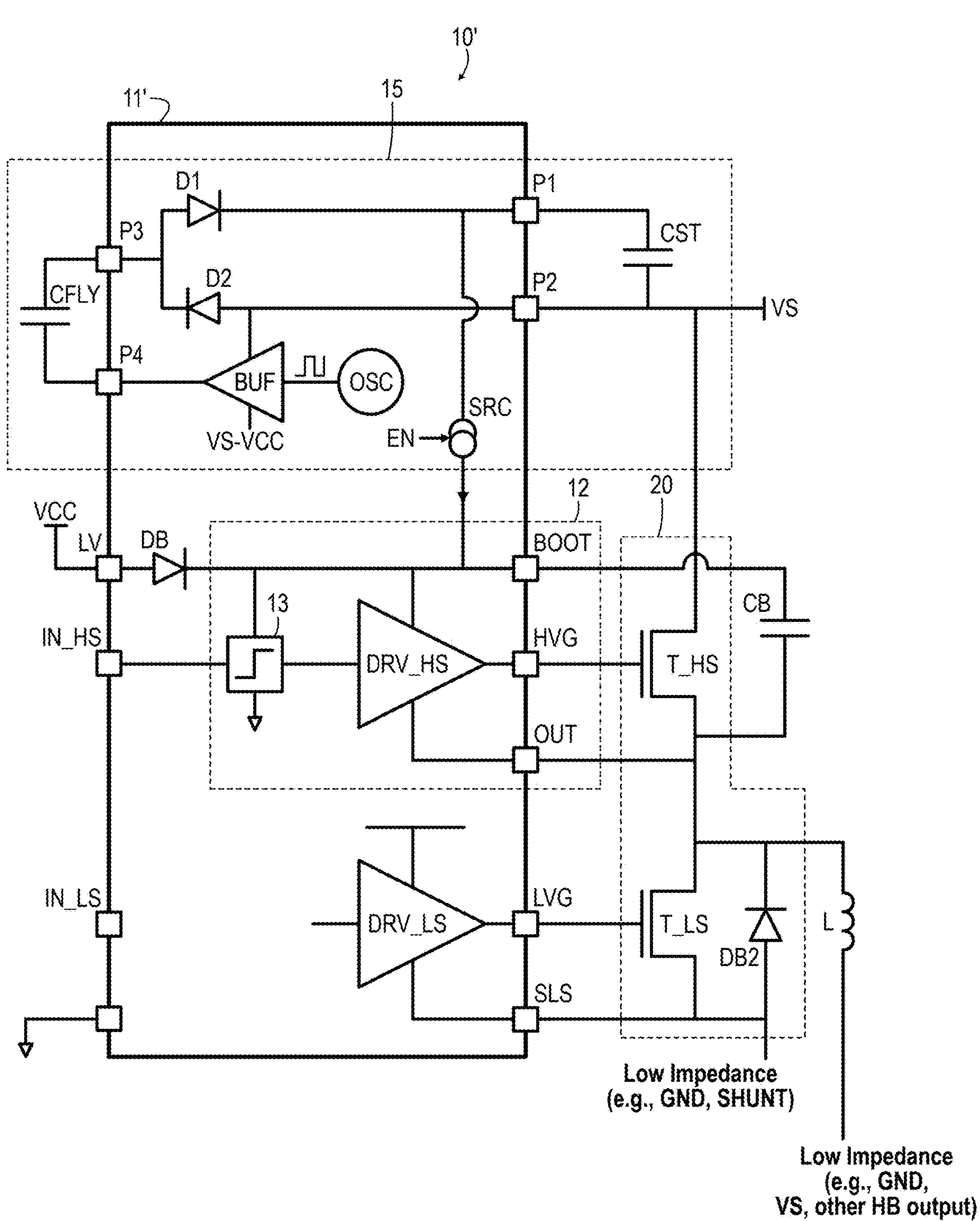
FIG. 3 is a schematic diagram of a prior art high-side driver circuit using the charge pump method.

The half-bridge 20 includes: n-channel transistor T_HS having its drain coupled to voltage VS, its source connected to output node OUT, and its gate connected to a high-side gate node HVG; and n-channel transistor T_LS having its drain connected to output node OUT, its source connected to ground node SLS (or any low impedance node, such as GND or a shunt resistor), and its gate connected to low-side gate node LVG. T_LS and its related driver can also be substituted for a simple recirculation diode (such as DB2, as shown in FIG. 1 or FIG. 3).

A bootstrap capacitor CB is connected between the bootstrap node BOOT and the output node OUT, and an inductor L is connected between the output node OUT and the node SLS (or any low impedance node, such as GND, VS, or another HB output).

The half-bridge driver circuit 11" includes a high-side driver circuit 12" including a driver DRV_HS receiving as input a pre-drive signal from a level shifter 13 operating based upon a high-side input signal received at high-side input node IN_HS. The driver DRV_HS is powered between the bootstrap node BOOT and the output node OUT, and provides output to high-side gate node HVG. Observe here that a trickle charge pump 14 is connected between the output node OUT and ground, and that it is not necessary for it to receive VS for it to properly function.

The half-bridge driver circuit 11" further includes a driver DRV_LS receiving as input a low-side input signal received at low-side input node IN_LS. The driver DRV_LS is powered between a low voltage LV and the voltage at the node SLS, and provides output to low-side gate node LVG. The T_LS and related driver can also be substituted by a recirculation diode DB2 (see, for example, FIG. 1 or FIG. 3)

During high-side on periods when high-side transistor T_HS is on and low-side transistor T_LS is off, in a first phase, a capacitor within the trickle charge pump 14 is charged, and in a second phase, charge is transferred from capacitor within the trickle charge pump 14 to the bootstrap capacitor CB so that the driver DRV_HS can maintain high-side transistor T_HS on for any duration, including indefinitely to achieve a 100% duty cycle.

Note that the low-side driver could alternatively be designed to operate between SLS and SLS+VCC to function as a level shifter. Additionally, T_LS could be replaced with a passive component (e.g., DB2), eliminating the need for the low-side driver entirely.

Figure 5:
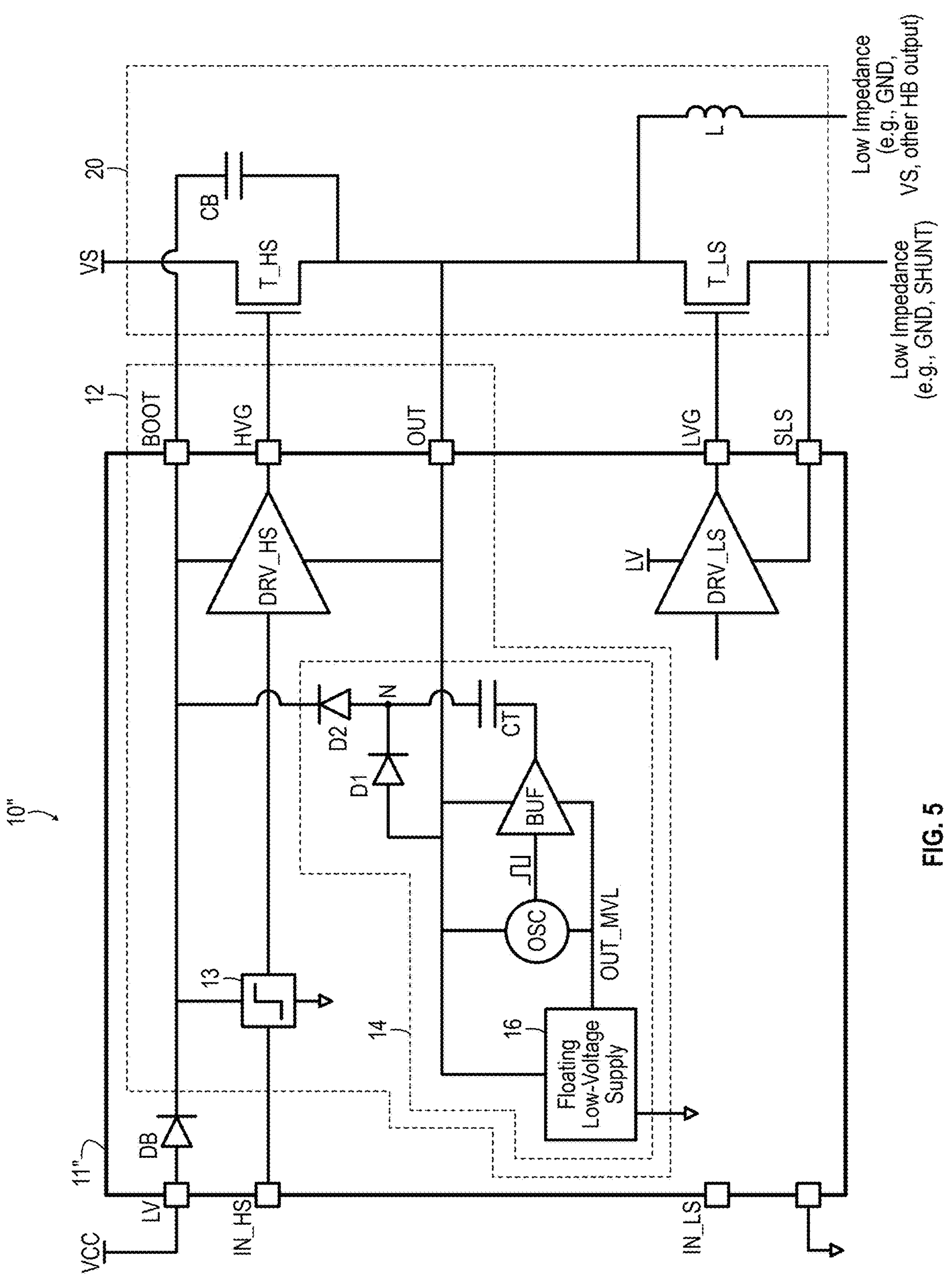
FIG. 5 is a schematic diagram of the high-side driver circuit of FIG. 4.

Refer now to FIG. 5, showing the details of the trickle charge pump 14. As can be observed, the trickle charge pump 14 includes a floating low-voltage supply 16 powered between the output node OUT and ground, with the floating low-voltage supply 16 generating a voltage OUT_MVL (OUT minus VCC, for example). An oscillator OSC is powered between the output node OUT and the voltage OUT_MVL, and generates an oscillator signal to the input of buffer BUF, which is powered between the output node OUT and the voltage OUT_MVL. A trickle capacitor CT is connected between the output of the buffer BUF and node N. A diode D1 has its anode connected to the output node OUT and its cathode connected to node N. A diode D2 has its anode connected to node N and its cathode connected to the bootstrap node BOOT.

Figure 5A:
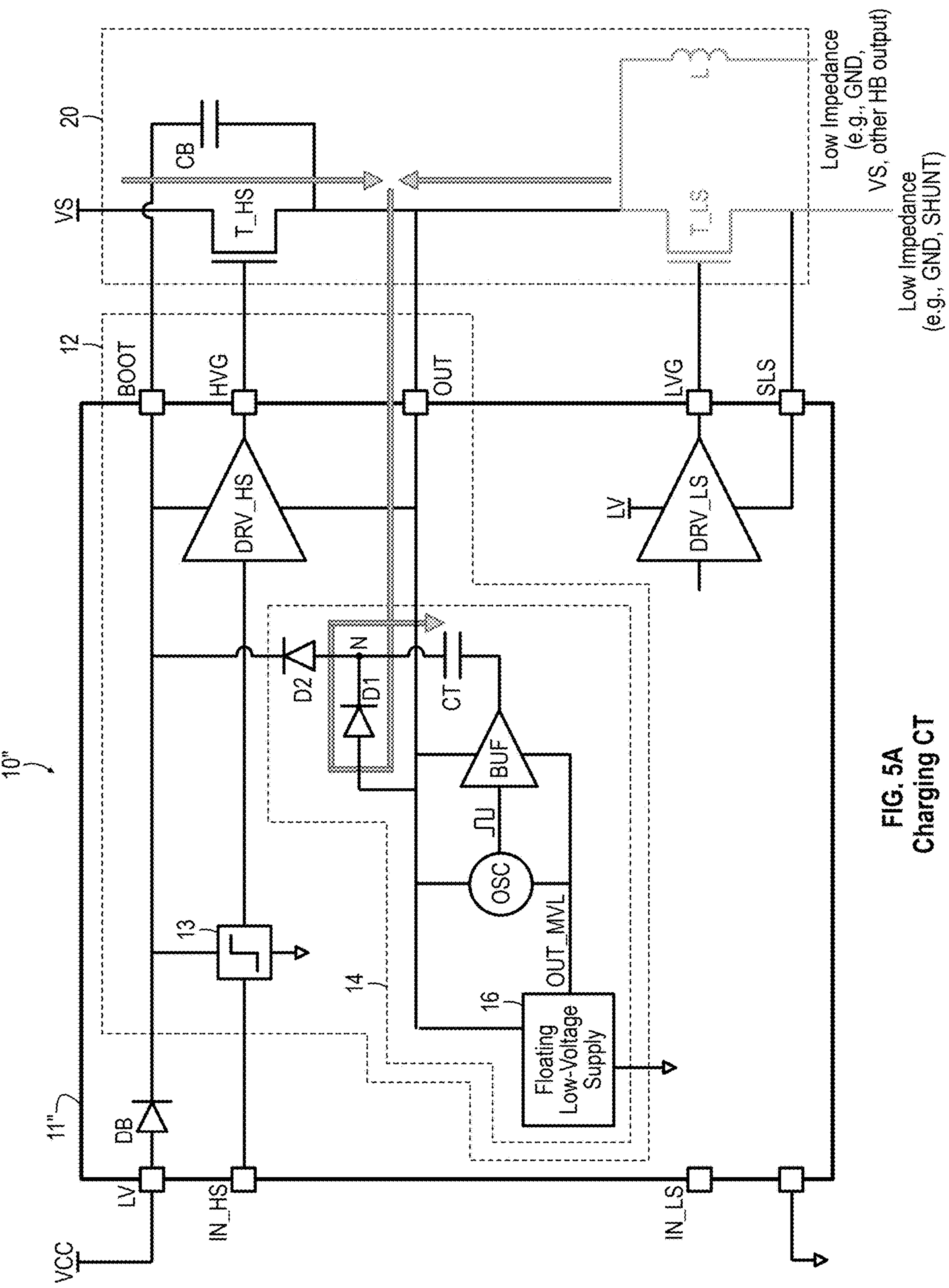
FIG. 5A illustrates the first phase of the trickle charge pump operation, where the trickle capacitor is charged.

The trickle charge pump 14 operates in a two-phase cycle to maintain the charge on the bootstrap capacitor CB, enabling extended or even indefinite operation of the high-side transistor T_HS. During the first phase, illustrated in FIG. 5A, the oscillator OSC output is low, and consequently, the buffer BUF output is also low. Current flows from the output node OUT (whether supplied through the conducting high-side transistor T_HS from VS or from the inductor current). From OUT, the current passes through diode D1 to node N, charging the trickle capacitor CT. The floating low-voltage supply 16, connected between node OUT and ground, provides the necessary voltage OUT_MVL to power the oscillator OSC and buffer BUF during this phase.

Figure 5B:
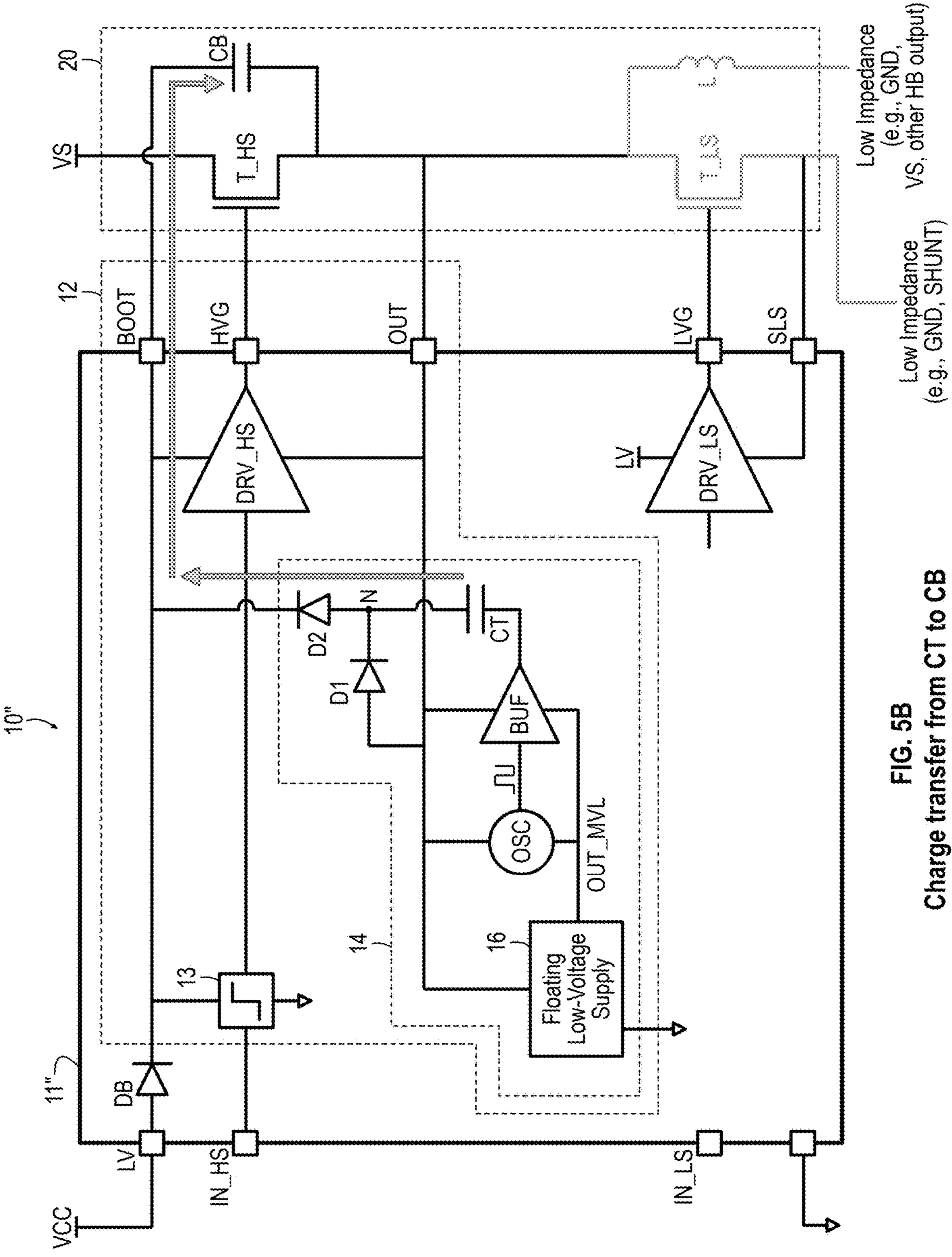
FIG. 5B shows the second phase of the trickle charge pump operation, where charge is transferred from the trickle capacitor to the bootstrap capacitor.

In the second phase, depicted in FIG. 5B, as the oscillator OSC output transitions high, the buffer BUF output follows, becoming high as well. This reverses the voltage across the trickle capacitor CT, causing it to discharge. The discharge current flows from CT, through node N and diode D2, to the bootstrap node BOOT, thereby charging the bootstrap capacitor CB. This charge transfer process replenishes any charge lost from capacitor CB to power the high-side driver DRV_HS, ensuring that DRV_HS has sufficient voltage to keep high-side transistor T_HS on. The alternating cycles of charging trickle capacitor CT from the output node OUT (FIG. 5A) and then transferring that charge to the bootstrap capacitor CB (FIG. 5B) continue as long as necessary, allowing for 100% duty cycle operation of the high-side transistor T_HS. This mechanism effectively overcomes the limitations of traditional bootstrap circuits, which typically cannot sustain indefinite high-side on-time due to the discharge of the bootstrap capacitor, without the added complexity of the prior design of FIG. 3.

The trickle charge pump 14 is naturally synchronized with the OUT node voltage.

Figure 5C:
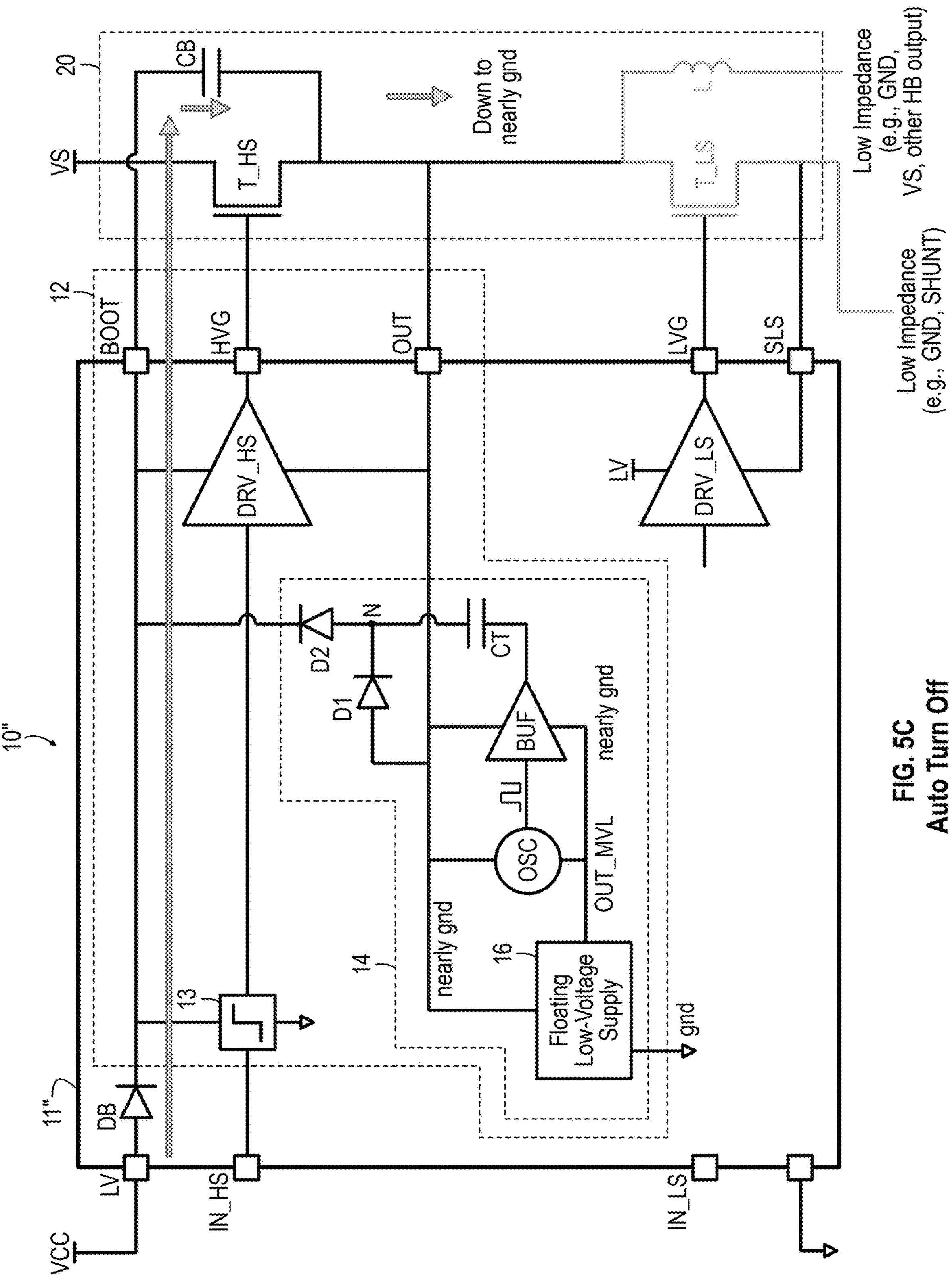
FIG. 5C depicts the auto-off functionality of the trickle charge pump during the low-side conduction phase.
Figure 5D:
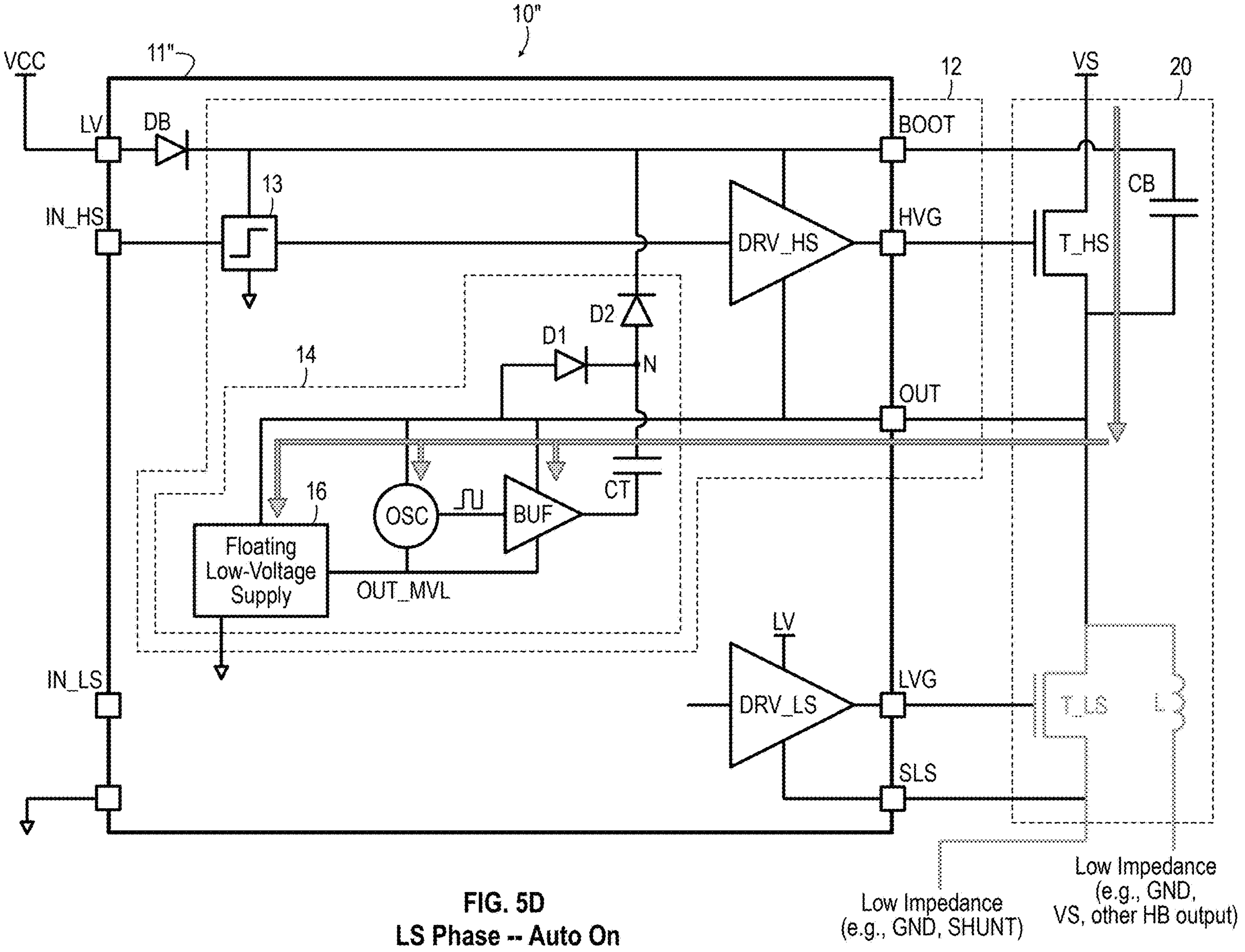
FIG. 5D illustrates the auto-on functionality of the trickle charge pump during the high-side conduction phase.

When the OUT node is low (either due to T_LS conducting or outgoing inductor current with T_HS off or with a recirculation diode DB2), illustrated in FIG. 5C, the trickle charge pump 14 automatically turns off. In this state, the high-side transistor T_HS is off while the OUT node is at a low voltage through node SLS (which may be connected to ground, a shunt, or other low impedance node). The bootstrap capacitor CB is charged through an alternative path: current flows from VCC, through node LV, then through bootstrap diode transistor DB, and finally through bootstrap node BOOT into CB. This low OUT node voltage causes the auto-off functionality by compressing the power supply for the trickle charge pump 14 components. Specifically, the floating low-voltage supply 16, oscillator OSC, and buffer BUF, which are all powered between node OUT and ground or OUT_MVL, are deprived of their operating voltage. Consequently, the charge pump 14 ceases operation during this phase.

The auto-on functionality activates when the OUT node voltage rises above VCC, causing the bootstrap diode DB to turn off. In this state, current at the output node OUT (whether supplied through the conducting transistor T_HS from VS or from the inductor L) provides power to the trickle charge pump 14 components. The floating low-voltage supply 16 generates the OUT_MVL voltage, powering the oscillator OSC and buffer BUF between node OUT and node OUT_MVL. With these components energized, the charge pump begins its two-phase operation as previously described: charging the trickle capacitor CT in one phase and transferring charge to the bootstrap capacitor CB in the other.

This auto-on/auto-off mechanism ensures that the trickle charge pump 14 operates only when OUT is high and the bootstrap diode DB cannot conduct, which is when additional charge is needed to maintain the bootstrap capacitor CB voltage. When OUT is low, the bootstrap capacitor CB can be directly charged through bootstrap diode DB, making the trickle charge pump 14 operation unnecessary. This intelligent, self-regulating design optimizes power efficiency and ensures proper operation of the half-bridge driver circuit across various duty cycle requirements, including sustained 100% duty cycle operation of the high-side transistor.

It should be noted that the trickle charge pump 14's operation depends solely on the OUT node voltage for its power supply. The VS node voltage is not necessary for its operation, as the charge pump is powered entirely from the OUT node.

Figure 6:
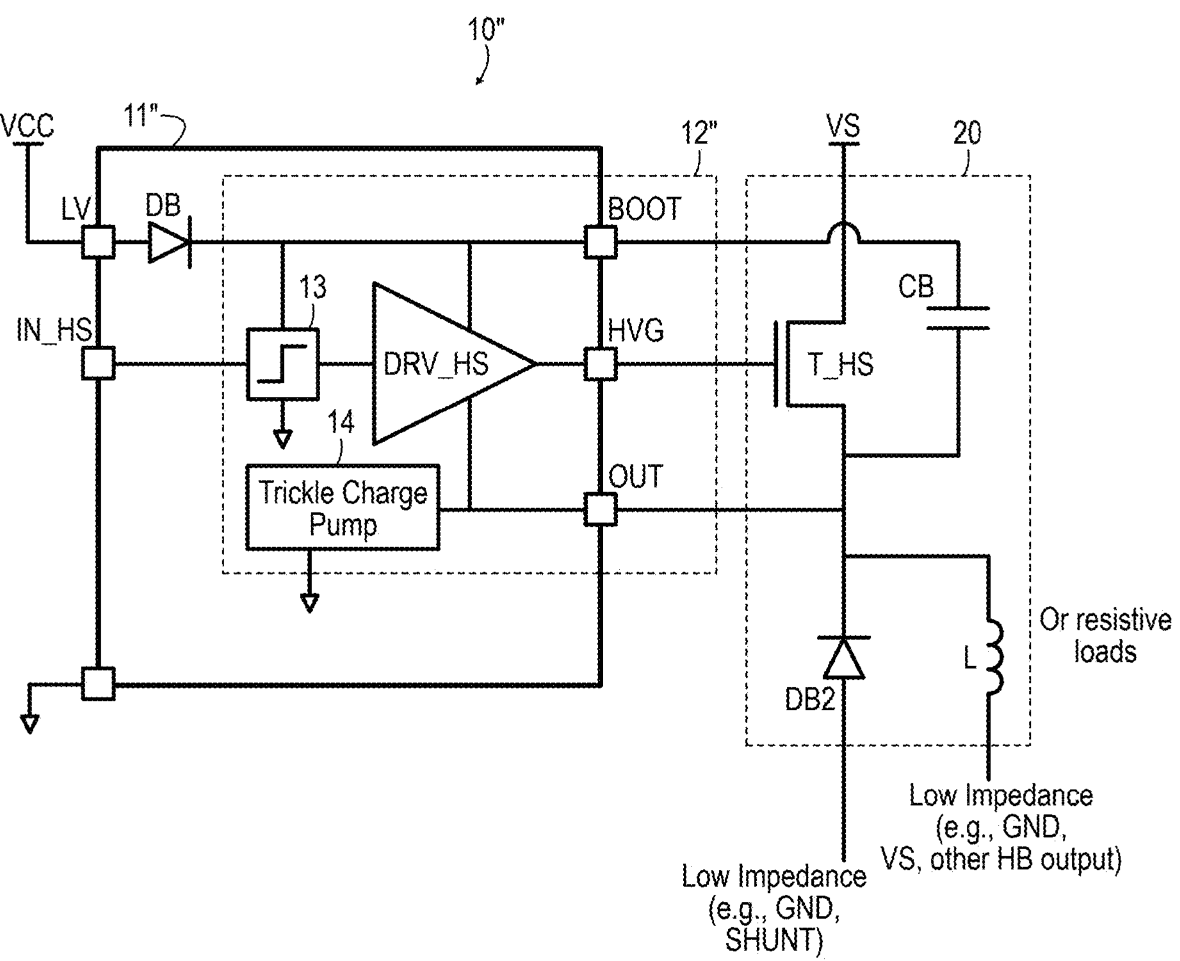
FIG. 6 is a schematic block diagram of a high-side driver circuit disclosed herein that illustrates the use of diode DB2 as an alternative instead of using DRV_LS and T_LS as a pull-down structure.

Finally, it is evident that modifications and variations can be made to what has been described and illustrated herein without departing from the scope of this disclosure. For example, referring now to FIG. 6, a schematic block diagram illustrates an alternative embodiment of system 10" wherein the low-side structure comprising driver DRV_LS and transistor T_LS is replaced with recirculation diode DB2. In this configuration, diode DB2 functions as a pull-down structure, driving output node OUT to ground when high-side transistor T_HS is inactive. It should be noted that the floating trickle charge pump 14 described above is fully compatible with this simplified configuration. Furthermore, the system 10" can accommodate various load configurations, wherein inductor L can be substituted with alternative passive loads (such as a resistor or capacitor) as illustrated in both FIG. 4 and FIG. 6, while maintaining proper operation of the floating trickle charge pump 14

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A half-bridge driver circuit, comprising:

a half-bridge including: a high-side transistor connected between a voltage supply and an output node, and a low-side transistor connected between the output node and a reference node;

a bootstrap capacitor connected between a bootstrap node and the output node;

a high-side driver circuit configured to drive a control terminal of the high-side transistor; and a trickle charge pump connected between the output node and ground, the trickle charge pump configured to charge the bootstrap capacitor during high-side conduction periods and/or when a voltage at the output node exceeds a voltage at a low voltage power supply node, wherein the trickle charge pump comprises:

a floating low-voltage supply powered between the output node and ground;

an oscillator powered between the output node and a voltage generated by the floating low-voltage supply;

a buffer powered between the output node and the voltage generated by the floating low-voltage supply, and coupled to receive an oscillator signal output from the oscillator;

a trickle capacitor connected between an output of the buffer and an intermediate node;

a first unidirectional conduction device connected between the output node and the intermediate node; and a second unidirectional conduction device connected between the intermediate node and the bootstrap node;

wherein the trickle charge pump is configured to operate, when the voltage at the output node exceeds the voltage at the low voltage power supply node, in:

a first phase wherein the trickle capacitor is charged through the first unidirectional conduction device; and a second phase wherein charge is transferred from the trickle capacitor to the bootstrap capacitor through the second unidirectional conduction device.

2. The half-bridge driver circuit of claim 1, wherein the trickle charge pump includes an auto-on/auto-off functionality that activates the trickle charge pump when the voltage at the output node exceeds the voltage at the low voltage power supply node and deactivates the trickle charge pump when the voltage at the output node is less than the voltage at the low voltage power supply node, wherein: the trickle charge pump is powered by the voltage at the output node, with activation occurring when the voltage at the output node exceeds the voltage at the low voltage power supply node; and the auto-off functionality occurs when the voltage at the output node is less than the voltage at the low voltage power supply node.

3. The half-bridge driver circuit of claim 1, further comprising: a level shifter configured to provide a pre-drive signal to the high-side driver circuit based on a high-side input signal; and a low-side driver circuit configured to drive the low-side transistor based on a low-side input signal.

4. The half-bridge driver circuit of claim 1, wherein the trickle charge pump is configured to enable 100% duty cycle operation of the high-side transistor by continuously replenishing charge in the bootstrap capacitor when the voltage at the output node exceeds the voltage at the low voltage power supply node.

5. A half-bridge driver circuit, comprising:

a half-bridge including: a high-side transistor connected between a voltage supply and an output node, and a low-side transistor connected between the output node and a reference node;

a bootstrap capacitor connected between a bootstrap node and the output node;

a high-side driver circuit configured to drive the high-side transistor; and a trickle charge pump connected between the output node and ground, wherein the trickle charge pump is configured to: activate when a voltage at the output node exceeds a voltage at a low voltage power supply node, and alternately charge a trickle capacitor and transfer charge from the trickle capacitor to the bootstrap capacitor when the voltage at the output node exceeds the voltage at the low voltage power supply node.

6. The half-bridge driver circuit of claim 5, wherein the trickle charge pump is further configured to: deactivate when the voltage at the output node is less than the voltage at the low voltage power supply node.

7. The half-bridge driver circuit of claim 5, wherein the trickle charge pump is powered by the voltage at the output node.

8. The half-bridge driver circuit of claim 5, wherein the trickle charge pump is configured to enable 100% duty cycle operation of the high-side transistor by continuously replenishing charge in the bootstrap capacitor when the voltage at the output node exceeds the voltage at the low voltage power supply node.

9. The half-bridge driver circuit of claim 5, further comprising: a level shifter configured to provide a pre-drive signal to the high-side driver circuit based on a high-side input signal; and a low-side driver circuit configured to drive the low-side transistor based on a low-side input signal.

10. The half-bridge driver circuit of claim 5, wherein the trickle charge pump comprises:

a floating low-voltage supply powered between the output node and ground;

an oscillator powered between the output node and a voltage generated by the floating low-voltage supply;

a buffer powered between the output node and the voltage generated by the floating low-voltage supply, and coupled to receive an oscillator signal output from the oscillator;

the trickle capacitor connected between an output of the buffer and an intermediate node;

a first unidirectional conducting device connected between the output node and the intermediate node; and a second unidirectional conducting device connected between the intermediate node and the bootstrap node.

11. A method of operating a high-side driver circuit, the method comprising:

driving a high-side transistor to generate a voltage when an output node exceeds a voltage at a low voltage power supply node;

activating a trickle charge pump connected between the output node and ground when the voltage at the output node exceeds the voltage at the low voltage power supply node; and alternately charging a trickle capacitor and transferring charge from the trickle capacitor to a bootstrap capacitor using the trickle charge pump when the voltage at the output node exceeds the voltage at the low voltage power supply node, wherein the bootstrap capacitor is connected between a bootstrap node and the output node.

12. The method of claim 11, further comprising:

driving a low-side transistor of the high-side driver circuit to generate a voltage at the output node that is less than the voltage at the low voltage power supply node; and deactivating the trickle charge pump when the voltage at the output node is less than the voltage at the low voltage power supply node.

13. The method of claim 12, wherein deactivating the trickle charge pump comprises connecting the output node to ground through the low-side transistor or a unidirectional conducting device.

14. The method of claim 11, wherein activating the trickle charge pump comprises powering the trickle charge pump using the voltage at the output node.

15. The method of claim 11, wherein alternately charging the trickle capacitor and transferring charge comprises: charging the trickle capacitor through a first unidirectional conducting device connected between the output node and the trickle capacitor during a first phase; and discharging the trickle capacitor through a second unidirectional conducting device connected between the trickle capacitor and the bootstrap node during a second phase.

16. The method of claim 11, further comprising: continuously replenishing charge in the bootstrap capacitor when the voltage at the output node exceeds the voltage at the low voltage power supply node to enable 100% duty cycle operation of the high-side transistor.

17. The method of claim 11, further comprising: level-shifting a high-side input signal to generate a pre-drive signal; and providing the pre-drive signal to a high-side driver circuit to drive the high-side transistor.

18. The method of claim 11, further comprising:

generating a voltage at the output node that is less than the voltage at the low voltage power supply node using a diode; and deactivating the trickle charge pump when the voltage at the output node is less than the voltage at the low voltage power supply node.

* * * * *